United States Patent
Rouh

(10) Patent No.: US 8,803,224 B2
(45) Date of Patent: Aug. 12, 2014

(54) MOS TRANSISTOR SUPPRESSING SHORT CHANNEL EFFECT AND METHOD OF FABRICATING THE SAME

(75) Inventor: Kyoung Bong Rouh, Goyang-si (KR)

(73) Assignee: SK hynix Inc., Icheon-si (KR)

( * ) Notice: Subject to any disclaimer, the term of this patent is extended or adjusted under 35 U.S.C. 154(b) by 118 days.

(21) Appl. No.: 13/551,385

(22) Filed: Jul. 17, 2012

(65) Prior Publication Data

US 2012/0280309 A1 Nov. 8, 2012

Related U.S. Application Data

(62) Division of application No. 11/770,168, filed on Jun. 28, 2007, now Pat. No. 8,222,101.

(30) Foreign Application Priority Data

Oct. 31, 2006 (KR) .......................... 10-2006-0106549

(51) Int. Cl.
*H01L 29/66* (2006.01)
*H01L 29/08* (2006.01)

(52) U.S. Cl.
USPC .................................... 257/327; 257/E29.04

(58) Field of Classification Search
CPC ..................... H01L 29/0847; H01L 29/66659; H01L 29/42368; H01L 29/7802; H01L 29/7801; H01L 29/7809; H01L 29/785; H01L 29/66795
USPC ............................................ 257/E29.04, 327
See application file for complete search history.

(56) References Cited

U.S. PATENT DOCUMENTS

| | | |
|---|---|---|
| 5,834,793 A | 11/1998 | Shibata |
| 5,949,103 A | 9/1999 | Lee |
| 6,010,936 A | 1/2000 | Son |
| 6,037,605 A | 3/2000 | Yoshimura |
| 6,727,558 B1 | 4/2004 | Duane et al. |
| 6,773,990 B1 | 8/2004 | Fastow et al. |
| 7,074,692 B2 | 7/2006 | Chen et al. |
| 7,129,152 B2 | 10/2006 | Fehlhaber et al. |
| 7,208,356 B2 | 4/2007 | Cho et al. |
| 7,223,646 B2 | 5/2007 | Miyashita et al. |
| 7,384,849 B2 | 6/2008 | Parekh et al. |
| 7,391,087 B2 | 6/2008 | Murthy et al. |
| 7,763,513 B2 | 7/2010 | Wang et al. |
| 2004/0259311 A1 | 12/2004 | Kim |
| 2006/0076619 A1* | 4/2006 | Wang et al. ................... 257/336 |
| 2007/0012994 A1 | 1/2007 | Chou et al. |

FOREIGN PATENT DOCUMENTS

| | | |
|---|---|---|
| JP | 10-107267 | 4/1998 |
| JP | 10-116988 | 5/1998 |
| JP | 2001-085677 | 3/2001 |

* cited by examiner

*Primary Examiner* — Phat X Cao
*Assistant Examiner* — Diana C Vieira
(74) *Attorney, Agent, or Firm* — Kilpatrick Townsend & Stockton LLP

(57) ABSTRACT

A MOS transistor suppressing a short channel effect includes a substrate, a first diffusion region and a second diffusion region separated from each other by a channel region in an upper portion of the substrate, a gate insulating layer including a first gate insulating layer disposed on a surface of the substrate in the channel region and a second gate insulating layer having a specified depth from the surface of the substrate to be disposed between the first diffusion region and the channel region, and a gate electrode disposed on the first gate insulating layer.

12 Claims, 10 Drawing Sheets

MOS TRANSISTOR SUPPRESSING SHORT CHANNEL EFFECT AND METHOD OF FABRICATING THE SAME

CROSS-REFERENCES TO RELATED APPLICATIONS

The present application is a divisional of U.S. patent application Ser. No. 11/770,168, filed on Jun. 28, 2007, which claims priority to Korean patent application number 2006-0106549, filed on 31 Oct. 2006, both of which are incorporated by reference in their entirety.

BACKGROUND OF THE INVENTION

The present invention relates to a MOS transistor, and more particularly to a MOS transistor for suppressing a short channel effect and a method of fabricating the same.

In recent years, along with the trend of high-integration semiconductor devices such as a dynamic random access memory (DRAM), various problems occur due to the short channel effect in a transistor of a semiconductor device.

As one example of the problems, a general rule of obtaining a threshold voltage independent of a channel length or width is no longer applicable, in particular, to a sub-100 nm channel structure. Accordingly, it is difficult to obtain a desired threshold voltage in a current transistor having a planar structure. Moreover, it is more difficult to obtain the desired threshold voltage in an upcoming transistor having a sub-50 nm channel structure.

As another example of the problems caused by the short channel effect, as the gate width of the transistor of the semiconductor device gets smaller, the density of impurities becomes higher in a contact region and a channel, thereby increasing the intensity of the electric field between a source region and a drain region. The increased intensity of the electric field accelerates electrons between the source region and the drain region to generate a number of hot carriers attacking a gate insulating layer near the drain region. It is known that the hot carriers degrade the electric characteristics of devices. In particular, in the case of semiconductor memory devices such as the DRAM, as the intensity of the electric field between the source region and the drain region increases, leakage current is generated to deteriorate the refresh characteristics of the DRAM.

In compliance with this trend, a variety of transistors having a three-dimensional structure, rather than the planar structure, have been proposed. For example, the transistors having the three-dimensional structure include a transistor having a recess channel and a transistor having a stepped profile. In the transistor having the recess channel, a recess is formed on a semiconductor substrate and a gate is formed in the recess such that the channel is formed along the recess, thereby increasing the effective channel length. In the transistor having the stepped profile, the surface of the active region is formed to have the stepped profile and a gate stack is formed on the stepped profile, thereby increasing the effective channel length while maintaining a constant area of the transistor.

The transistors having the three-dimensional structure including the transistor having the recess channel and the transistor having the stepped profile provide an effect of efficiently suppressing the short channel effect. However, the transistors having the three-dimensional structure have a complicated structure compared to the transistors having the planar gate structure and a method of fabricating the transistors having the three-dimensional structure is also complicated.

BRIEF SUMMARY OF THE INVENTION

The present invention relates to a MOS transistor comprising of: a substrate; a first diffusion region and a second diffusion region separated from each other by a channel region in an upper portion of the substrate; a gate insulating layer including a first gate insulating layer disposed on the channel region of the substrate and a second gate insulating layer having a specified depth from the surface of the substrate to be disposed between the first diffusion region and the channel region; and a gate electrode disposed on the first gate insulating layer.

The first gate insulating layer and the second gate insulating layer may include a silicon oxide layer.

The depth of the second gate insulating layer may be 30 nm to 100 nm.

The first diffusion region and the second diffusion region may be respectively a source region and a drain region.

Further, the first diffusion region and the second diffusion region may be respectively a drain region and a source region.

Another aspect of the present invention is to provide a MOS transistor comprising: a substrate; a first diffusion region and a second diffusion region separated from each other by a channel region in an upper portion of the substrate; a gate insulating layer including a first gate insulating layer disposed on the channel region of the substrate, a second gate insulating layer having a specified depth from the surface of the substrate to be disposed between the first diffusion region and the channel region, and a third gate insulating layer having a specified depth from the surface of the substrate to be disposed between the second diffusion region and the channel region; and a gate electrode disposed on the first gate insulating layer.

The first gate insulating layer, the second gate insulating layer and the third gate insulating layer may include a silicon oxide layer.

The depth of the second gate insulating layer may be 30 nm to 100 nm.

The depth of the third gate insulating layer may be 30 nm to 100 nm.

The depth of the second gate insulating layer may be different from that of the third gate insulating layer.

The first diffusion region and the second diffusion region may be respectively a source region and a drain region.

The first diffusion region and the second diffusion region may be respectively a drain region and a source region.

Yet another aspect of the present invention is to provide a method for fabricating a MOS transistor comprising: forming a groove of a specified depth in a substrate including a channel region using a mask layer pattern exposing a surface portion of the substrate adjacent to the channel region; forming an insulating layer on the substrate to form a first gate insulating layer disposed on the channel region and a second gate insulating layer filled in the groove; forming a gate electrode on the first gate insulating layer; and forming a first diffusion region and a second diffusion region to be separated from each other by the channel region in an upper portion of the substrate.

The depth of the groove may be 30 nm to 100 nm.

The groove may be formed by employing a wet etching method or a dry etching method using plasma.

The insulating layer may be formed of a silicon oxide layer.

The first gate insulating layer and the second gate insulating layer of the silicon oxide layer may be formed by using a wet oxidation method or a dry oxidation method.

The method for fabricating a MOS transistor may further comprise performing channel ion implantation in a region adjacent to the second gate insulating layer.

Yet another aspect of the present invention is to provide a method for fabricating a MOS transistor comprising: forming a first groove and a second groove separated from each other in a substrate including a channel region; forming an insulating layer on the substrate to form a first gate insulating layer disposed on the channel region, a second gate insulating layer filled in the first groove, and a third gate insulating layer filled in the second groove; forming a gate electrode on the first gate insulating layer; and forming a first diffusion region and a second diffusion region to be separated from each other by the channel region in an upper portion of the substrate.

A depth of the first groove may be equal to that of the second groove.

A depth of the first groove may be different from that of the second groove.

The method for fabricating a MOS transistor may further comprise performing channel ion implantation in a region adjacent to the second gate insulating layer and the third gate insulating layer.

DETAILED DESCRIPTION OF THE INVENTION

The embodiments of the present invention will now be described in detail with reference to the accompanying drawings. These embodiments are used only for illustrative purposes, and the present invention is not limited thereto.

Figure 1:
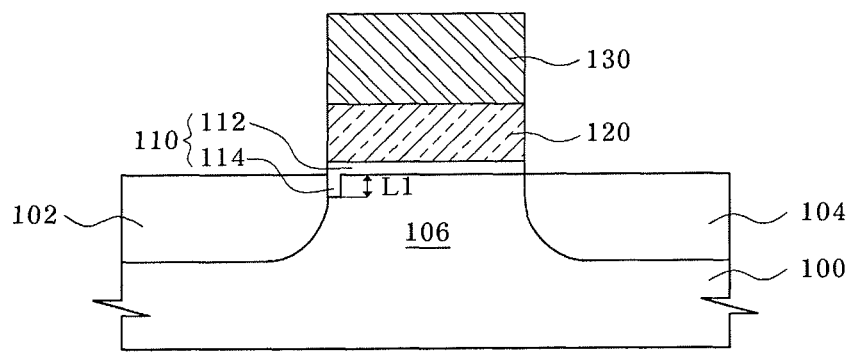
FIG. 1 shows a cross sectional view of a MOS transistor according to a first embodiment of the present invention.

FIG. 1 shows a cross sectional view of a MOS transistor according to a first embodiment of the present invention. Referring to FIG. 1, a first diffusion region 102 and a second diffusion region 104 are disposed in an upper portion of a substrate 100 such as a silicon substrate. The first diffusion region 102 and the second diffusion region 104 are a source region and a drain region, respectively. According to circumstances, the first diffusion region 102 and the second diffusion region 104 may be a drain region and a source region, respectively. A channel region 106 is disposed near the surface of the substrate 100 between the first diffusion region 102 and the second diffusion region 104. An inversion layer is formed in the channel region 106 under specific conditions.

A gate insulating layer 110 includes a first gate insulating layer 112 and a second gate insulating layer 114. The first insulating layer is disposed on the surface of the substrate 100, especially on the channel region 106. The second gate insulating layer 114 is disposed between the first diffusion region 102 and the channel region 106 and has a specified depth L1 from the surface of the substrate 100. The depth L1 of the second gate insulating layer 114 is about 30 nm to 100 nm. If the second gate insulating layer 114 has a very small depth L1, it may be difficult to suppress the short channel effect. If the second gate insulating layer 114 has a very large depth L1, a carrier moving path may be blocked between the first diffusion region 102 and the channel region 106. The first gate insulating layer 112 and the second gate insulating layer 114 may be a silicon oxide layer, but they may be a high-k dielectric layer such as alumina ($Al_2O_3$) without being limited thereto.

A gate electrode 120 is disposed on the first gate insulating layer 112 and a gate hard mask layer 130 is disposed on the gate electrode 120. The gate electrode 120 is a polysilicon layer doped with impurities. The gate electrode 120 may have a sequentially deposited structure including a polysilicon layer doped with impurities and a metal silicide layer such as a tungsten silicide layer. Further, according to the field of application, the gate electrode 120 may be a metal layer such as a tungsten (W) layer. The gate hard mask layer 130 is a nitride layer.

When a bias greater than a threshold voltage is applied to the gate electrode 120, the inversion layer is formed in the channel region 106. Accordingly, carriers move from the first diffusion region 102 to the second diffusion region 104 through the inversion layer. In this case, since the second gate insulating layer 114 having the specified depth L1 is disposed between the first diffusion region 102 and the channel region 106 including the inversion layer, the carriers are blocked from moving along the surface of the substrate 100 from the first diffusion region 102 to the inversion layer. Instead, the carriers move around the second gate insulating layer 114 from the first diffusion region 102 to the inversion layer. Thus, the carrier moving path is extended compared to when the carriers move along the surface of the substrate 100, thereby increasing an effective channel length and suppressing the short channel effect.

Figure 2:
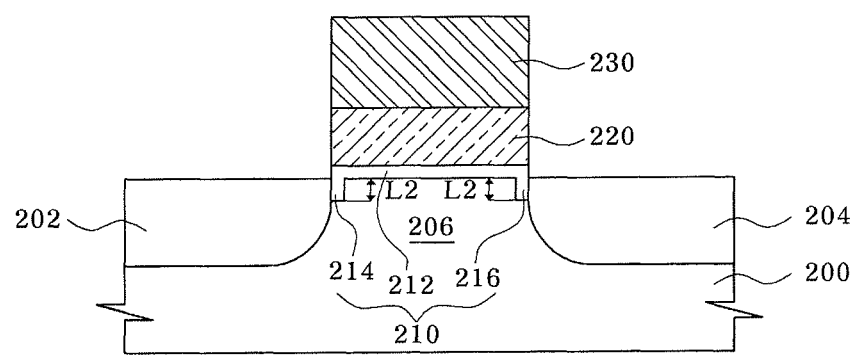
FIG. 2 shows a cross sectional view of a MOS transistor according to a second embodiment of the present invention.

FIG. 2 shows a cross sectional view of a MOS transistor according to a second embodiment of the present invention. Referring to FIG. 2, a first diffusion region 202 and a second diffusion region 204 are disposed in an upper portion of a substrate 200 such as a silicon substrate. The first diffusion region 202 and the second diffusion region 204 are a source region and a drain region, respectively. According to circumstances, the first diffusion region 202 and the second diffusion region 204 may be a drain region and a source region, respectively. A channel region 206 is disposed near the surface of the substrate 200 between the first diffusion region 202 and the second diffusion region 204. An inversion layer is formed in the channel region 206 under specific conditions.

A gate insulating layer 210 includes a first gate insulating layer 212 disposed on the surface of the substrate 200 in the channel region 206, a second gate insulating layer 214 having a specified depth L2 from the surface of the substrate 200 to be disposed between the first diffusion region 202 and the channel region 206, and a third gate insulating layer 216 having a specified depth L2 from the surface of the substrate 200 to be disposed between the channel region 206 and the second diffusion region 204. The depth L2 of both the second gate insulating layer 214 and the third gate insulating layer 216 is about 30 nm to 100 nm. The first gate insulating layer 212, the second gate insulating layer 214 and the third gate insulating layer 216 may be a silicon oxide layer, but they may be a high-k dielectric layer such as alumina ($Al_2O_3$) without being limited thereto.

A gate electrode 220 is disposed on the first gate insulating layer 212 and a gate hard mask layer 230 is disposed on the gate electrode 220. The gate electrode 220 is a polysilicon layer doped with impurities. The gate electrode 220 may have a sequentially deposited structure including a polysilicon layer doped with impurities and a metal silicide layer such as a tungsten silicide layer. Further, according to the field of application, the gate electrode 220 may be a metal layer such as a tungsten (W) layer. The gate hard mask layer 230 is a nitride layer.

When a bias greater than a threshold voltage is applied to the gate electrode 220, an inversion layer is formed in the channel region 206. Accordingly, carriers move from the first diffusion region 202 to the second diffusion region 204 through the inversion layer. In this case, the second gate insulating layer 214 having the specified depth L2 is disposed between the first diffusion region 202 and the channel region 206 including the inversion layer, and the third gate insulating layer 216 having the specified depth L2 is disposed between the channel region 206 and the second diffusion region 204. Consequently, the carriers are blocked from moving along the surface of the substrate 200 from the first diffusion region 202 to the inversion layer and moving along the surface of the substrate 200 from the inversion layer to the second diffusion region 204. Instead, the carriers move around the second gate insulating layer 214 from the first diffusion region 102 to the inversion layer. Further, the carriers move around the third gate insulating layer 216 from the inversion layer to the second diffusion region 204. That is, at both ends of the channel region 206, the carriers move around the second gate insulating layer 214 and the third gate insulating layer 216 without moving along the surface of the substrate 200. Thus, the carrier moving path is further extended compared to that of the first embodiment described referring to FIG. 1, thereby further increasing the effective channel length.

Figure 3:
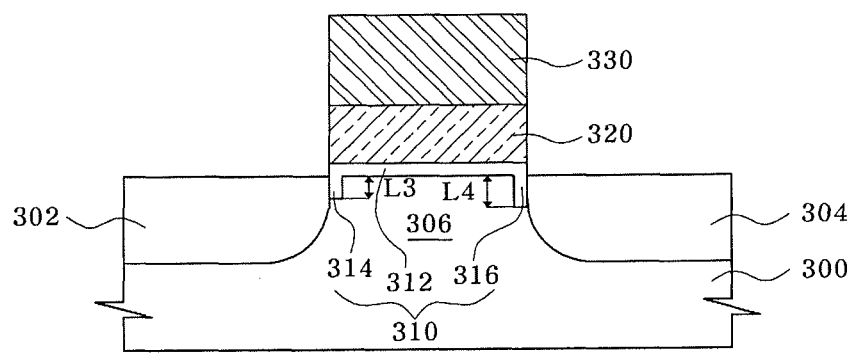
FIG. 3 shows a cross sectional view of a MOS transistor according to a third embodiment of the present invention.

FIG. 3 shows a cross sectional view of a MOS transistor according to a third embodiment of the present invention. Referring to FIG. 3, a first diffusion region 302 and a second diffusion region 304 are disposed on a substrate 300 such as a silicon substrate. The first diffusion region 302 and the second diffusion region 304 are a source region and a drain region, respectively. According to circumstances, the first diffusion region 302 and the second diffusion region 304 may be a drain region and a source region, respectively. A channel region 306 is disposed near the surface of the substrate 300 between the first diffusion region 302 and the second diffusion region 304. An inversion layer is formed in the channel region 306 under certain conditions.

A gate insulating layer 310 includes a first gate insulating layer 312 disposed on the surface of the substrate 300 in the channel region 306, a second gate insulating layer 314 having a specified depth L3 from the surface of the substrate 300 to be disposed between the first diffusion region 302 and the channel region 306, and a third gate insulating layer 316 having a specified depth L4 from the surface of the substrate 300 to be disposed between the channel region 306 and the second diffusion region 304. The depth L3 of the second gate insulating layer 314 is about 30 nm to 100 nm. The depth L4 of the third gate insulating layer 316 is relatively larger than the depth L3 of the second gate insulating layer 314. In one example, the depth L4 of the third gate insulating layer 316 is about 60 nm to 200 nm. In another example, the depth L4 of the third gate insulating layer 316 is about 300 nm to 1000 nm. Thus, the effective channel length is further extended due to the larger depth of the third gate insulating layer 316, thereby further suppressing the short channel effect.

A gate electrode 320 is disposed on the first gate insulating layer 312 and a gate hard mask layer 330 is disposed on the gate electrode 320. The gate electrode 320 is a polysilicon layer doped with impurities. The gate electrode 320 may have a sequentially deposited structure including a polysilicon layer doped with impurities and a metal silicide layer such as a tungsten silicide layer. Further, according to the field of application, the gate electrode 320 may be a metal layer such as a tungsten (W) layer. The gate hard mask layer 330 is a nitride layer.

Figure 4A:
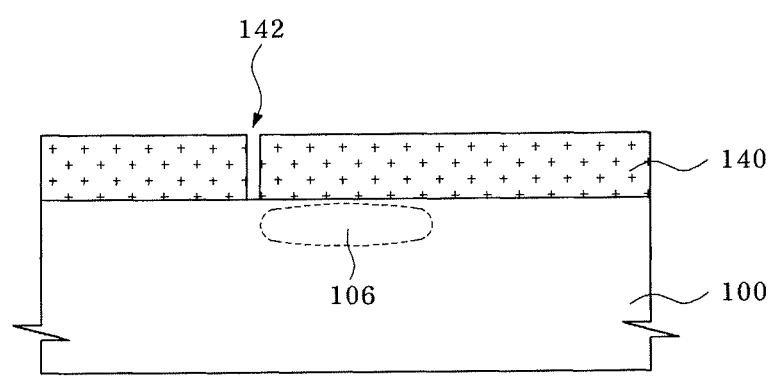
FIGS. 4A to 4E show cross sectional views for explaining a method for manufacturing the MOS transistor according to the first embodiment of the present invention.

FIGS. 4A to 4E show cross sectional views for explaining a method for manufacturing the MOS transistor according to the first embodiment of the present invention. Referring to FIG. 4A, a mask layer pattern 140 is formed on the substrate 100 including the channel region 106. Although not shown in the drawings, implantation may be performed to form a well, a field stop and a punchthrough stopper in the substrate 100. The mask layer pattern 140 may be formed of a photoresist layer, but it is not limited thereto. The mask layer pattern 140 has an opening 142 exposing a portion of the surface of the substrate 100. The portion of the surface of the substrate 100 exposed by the opening 142 is adjacent to the channel region 106.

Figure 4B:
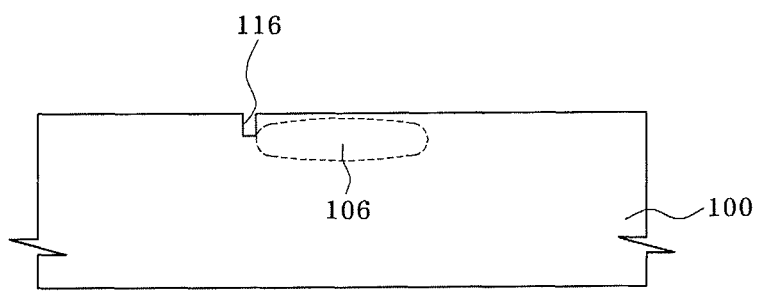

Referring to FIG. 4B, the exposed portion of the substrate 100 is etched to a specified depth using the mask layer pattern 140 shown in FIG. 4A as an etching mask, thereby forming a groove 116. In this case, the groove 116 is formed by using a wet etching method. In another embodiment, the groove 116 may be formed by employing a dry etching method using plasma. The groove 116 is formed to have a depth of approximately 30 nm to 100 nm. After the groove 116 is formed, the mask layer pattern 140 is removed. Although not shown in the drawings, after the groove 116 is formed, implantation for adjusting a threshold voltage may be performed in the channel region 106. Further, the implantation for adjusting a threshold voltage may be performed around the groove 116.

Figure 4C:
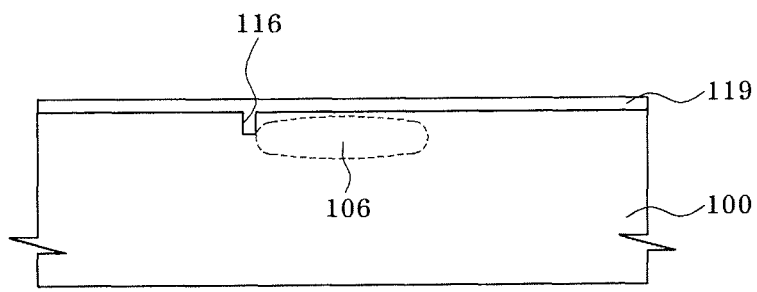

Referring to FIG. 4C, an insulating layer 119 is formed on the surface of the substrate 100. The insulating layer 119 serving as a gate insulating layer is formed of a silicon oxide ($SiO_2$) layer, but it may be formed of a high-k dielectric layer such as alumina ($Al_2O_3$). The insulating layer 119 of the silicon oxide ($SiO_2$) layer is formed by using a wet oxidation method under conditions for achieving the maximum step coverage or a dry oxidation method. Also in the case of using another material, the insulating layer 119 is formed to cover the surface of the substrate 100 while being filled in the groove 116.

Figure 4D:
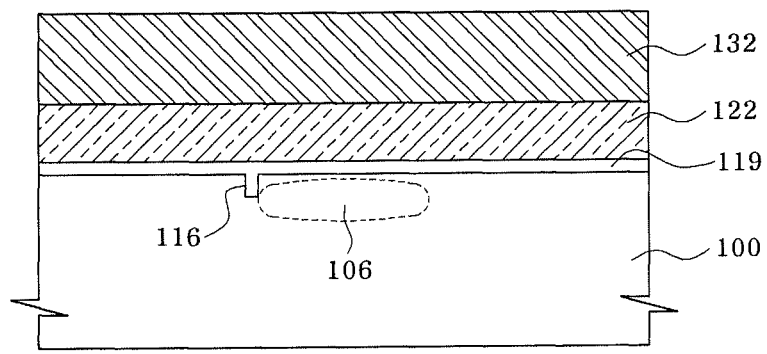

Referring to FIG. 4D, a conductive layer 122 for forming a gate electrode and an insulating layer 132 for forming a gate hard mask layer are sequentially formed on the insulating layer 119. The conductive layer 122 for forming a gate electrode is formed of a polysilicon layer doped with impurities. The conductive layer 122 may be formed to have a sequentially laminated structure including a polysilicon layer doped with impurities and a metal silicide layer. Further, according to circumstances, the conductive layer 122 may be formed of a metal layer. The insulating layer 132 for forming a gate hard mask layer is formed of a nitride layer.

Figure 4E:
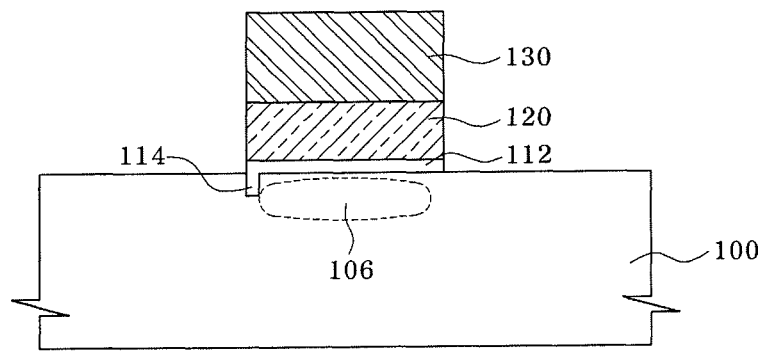

Referring to FIG. 4E, a planar gate stack is formed on the channel region 106 by patterning the insulating layer 132 for forming a gate hard mask layer, the conductive layer 122 for forming a gate electrode and the insulating layer 119 shown in FIG. 4D. The gate stack includes the first gate insulating layer 112 disposed on the channel region 106, the second gate insulating layer 114 adjacent to the channel region 106 and buried in the substrate 100, and the gate electrode 120 and the gate hard mask layer 130 that are sequentially disposed on first gate insulating layer 112. Then, a gate spacer layer (not shown) is formed on the side wall of the gate stack. Implantation and diffusion are performed to form the first diffusion region 102 and the second diffusion region 104, serving as a source region and a drain region, in the upper portion of the substrate 100 as shown in FIG. 1.

Figure 5A:
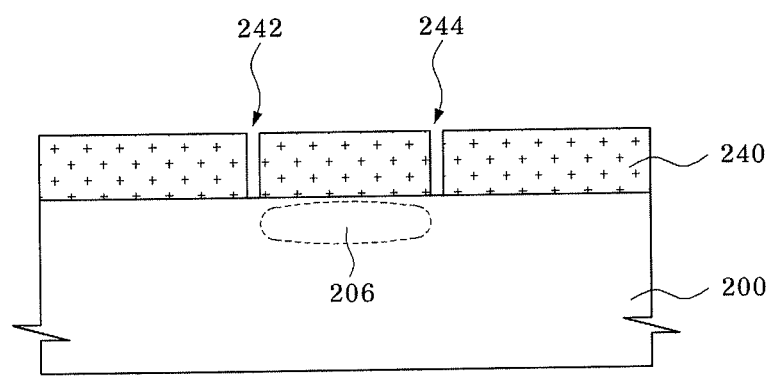
FIGS. 5A to 5E show cross sectional views for explaining a method for manufacturing the MOS transistor according to the second embodiment of the present invention.

FIGS. 5A to 5E show cross sectional views for explaining a method for manufacturing the MOS transistor according to the second embodiment of the present invention. Referring to FIG. 5A, a mask layer pattern 240 is formed on the substrate 200 including the channel region 206. Although not shown in the drawings, implantation may be performed to form a well, a field stop and a punchthrough stopper in the substrate 200. The mask layer pattern 240 may be formed of a photoresist layer, but it is not limited thereto. The mask layer pattern 240 has a first opening 242 and a second opening 244 exposing portions of the surface of the substrate 200. The portions of the surface of the substrate 200 exposed by the first opening 242 and the second opening 244 are adjacent to the channel region 206.

Figure 5B:
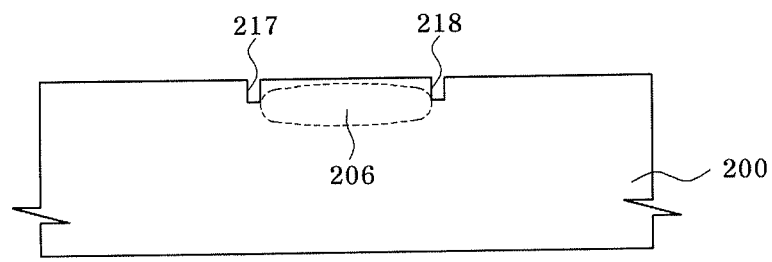

Referring to FIG. 5B, the exposed portions of the substrate 200 are etched to a specified depth using the mask layer pattern 240 shown in FIG. 5A as an etching mask, thereby forming a first groove 217 and a second groove 218 at both end portions of the channel region 206. In this case, the first groove 217 and the second groove 218 are formed by using a wet etching method. In another embodiment, the first groove 217 and the second groove 218 may be formed by employing a dry etching method using plasma. The first groove 217 and the second groove 218 are formed to have a depth of approximately 30 nm to 100 nm. After the first groove 217 and the second groove 218 are formed, the mask layer pattern 240 is removed. Although not shown in the drawings, after the first groove 217 and the second groove 218 are formed, implantation for adjusting a threshold voltage may be performed in the channel region 206. Further, the implantation for adjusting a threshold voltage may be performed around the first groove 217 and the second groove 218.

Figure 5C:
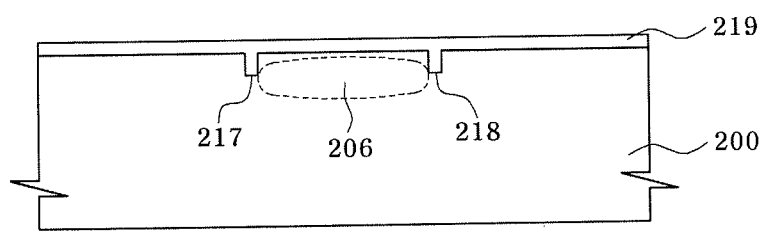

Referring to FIG. 5C, an insulating layer 219 is formed on the surface of the substrate 200. The insulating layer 219 serving as a gate insulating layer is formed of a silicon oxide ($SiO_2$) layer, but it may be formed of a high-k dielectric layer such as alumina ($Al_2O_3$). The insulating layer 219 of the silicon oxide ($SiO_2$) layer is formed by using a wet oxidation method under conditions for achieving the maximum step coverage to be filled in the first groove 217 and the second groove 218 or a dry oxidation method. Also in the case of using another material, the insulating layer 219 is formed to cover the channel region 206 of the substrate 200 while being filled in the first groove 217 and the second groove 218.

Figure 5D:
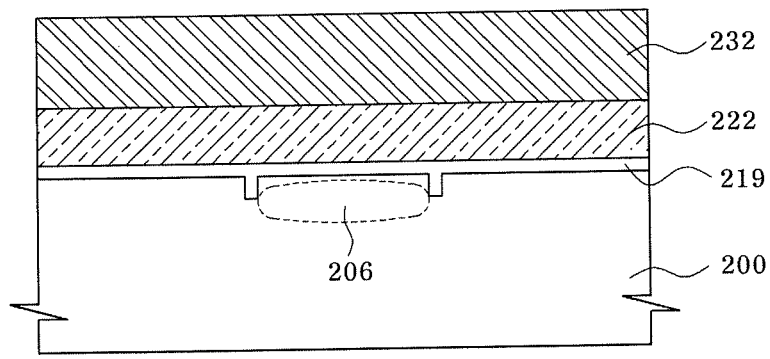

Referring to FIG. 5D, a conductive layer 222 for forming a gate electrode and an insulating layer 232 for forming a gate hard mask layer are sequentially formed on the insulating layer 219. The conductive layer 222 for forming a gate electrode is formed of a polysilicon layer doped with impurities. The conductive layer 222 may be formed to have a sequentially laminated structure including a polysilicon layer doped with impurities and a metal silicide layer. Further, according to circumstances, the conductive layer 222 may be formed of a metal layer. The insulating layer 232 for forming a gate hard mask layer is formed of a nitride layer.

Figure 5E:
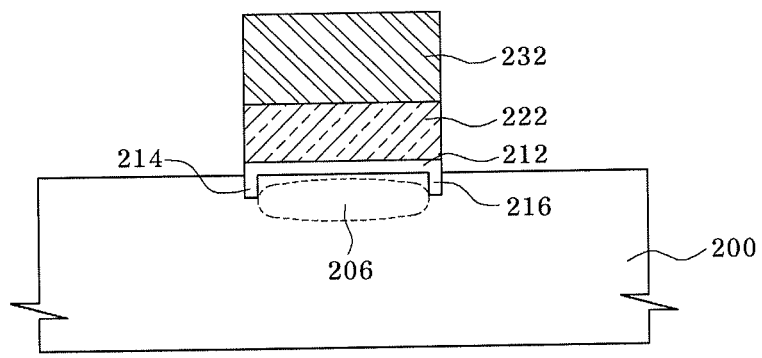

Referring to FIG. 5E, a planar gate stack is formed on the channel region 206 by patterning the insulating layer 232 for forming a gate hard mask layer, the conductive layer 222 for forming a gate electrode and the insulating layer 219 shown in FIG. 5D. The gate stack includes the first gate insulating layer 212 disposed on the channel region 206, the second gate insulating layer 214 and the third gate insulating layer 216 that are adjacent to the channel region 206 and buried in the substrate 200, and the gate electrode 220 and the gate hard mask layer 230 that are sequentially disposed on first gate insulating layer 212. Then, a gate spacer layer (not shown) is formed on the side wall of the gate stack. Implantation and diffusion are performed to form the first diffusion region 202 and the second diffusion region 204, serving as a source region and a drain region, in the upper portion of the substrate 200 as shown in FIG. 2.

Figure 6A:
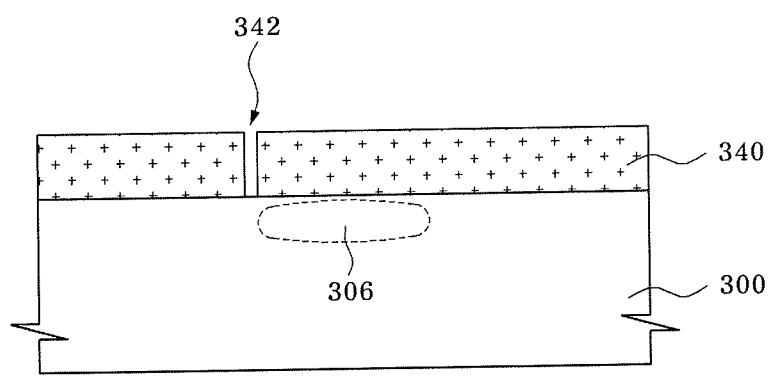
FIGS. 6A to 6F show cross sectional views for explaining a method for manufacturing the MOS transistor according to the third embodiment of the present invention.

FIGS. 6A to 6F show cross sectional views for explaining a method for manufacturing the MOS transistor according to the third embodiment of the present invention. Referring to FIG. 6A, a first mask layer pattern 340 is formed on the substrate 300 including the channel region 306. Although not shown in the drawings, implantation may be performed to form a well, a field stop and a punchthrough stopper in the substrate 300. The first mask layer pattern 340 may be formed of a photoresist layer, but it is not limited thereto. The first mask layer pattern 340 has an opening 342 exposing a portion of the surface of the substrate 300. The portion of the surface of the substrate 300 exposed by the opening 342 is adjacent to one side of the channel region 306.

Figure 6B:
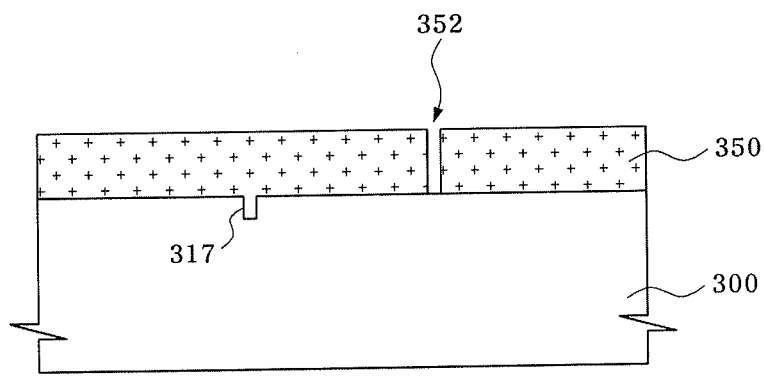

Referring to FIG. 6B, the exposed portion of the substrate 300 is etched to a specified depth using the first mask layer pattern 340 shown in FIG. 6A as an etching mask, thereby forming a first groove 317. In this case, the first groove 317 is formed by using a wet etching method. In another embodiment, the first groove 317 may be formed by employing a dry etching method using plasma. The first groove 317 is formed to have a depth of approximately 30 nm to 100 nm. After the first groove 317 is formed, the first mask layer pattern 340 is removed. Next, a second mask layer pattern 350 is formed on the substrate 300 having the first groove 317. The second mask layer pattern 350 may be formed of a photoresist layer, but it is not limited thereto. The second mask layer pattern 350 has an opening 352 exposing a portion of the surface of the substrate 300. The portion of the surface of the substrate 300 exposed by the opening 352 is adjacent to the other side of the channel region 306.

Figure 6C:
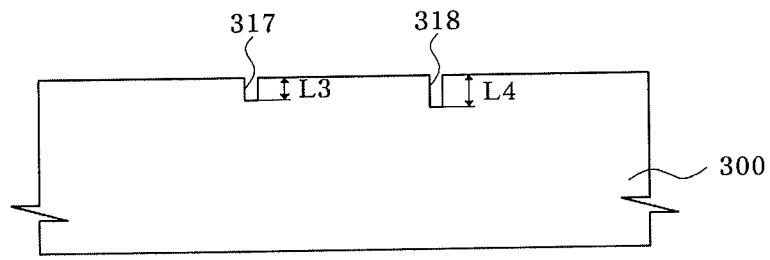

Referring to FIG. 6C, the exposed portion of the substrate 300 is etched to a specified depth using the second mask layer pattern 350 shown in FIG. 6B as an etching mask, thereby forming a second groove 318. In this case, the second groove 318 is formed by using a wet etching method. In another embodiment, the second groove 318 may be formed by employing a dry etching method using plasma. The second groove 318 is formed to have a depth of approximately 30 nm to 100 nm. However, the second groove 318 is formed such that the depth L4 of the second groove 318 is relatively larger than the depth L3 of the first groove 317. After the second groove 318 is formed, the second mask layer pattern 350 is removed. Although not shown in the drawings, after the first groove 317 and the second groove 318 are formed, implantation for adjusting a threshold voltage may be performed in the channel region 306. Further, the implantation for adjusting a threshold voltage may be performed around the first groove 317 and the second groove 318.

Figure 6D:
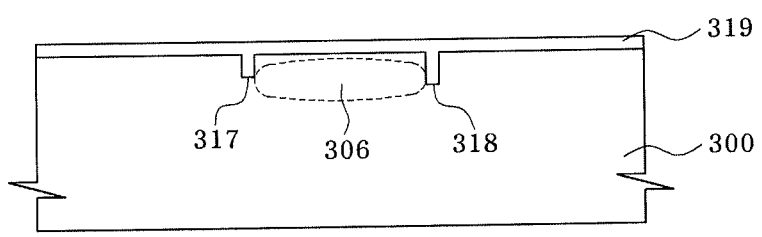

Referring to FIG. 6D, an insulating layer 319 is formed on the surface of the substrate 300. The insulating layer 319 serving as a gate insulating layer is formed of a silicon oxide ($SiO_2$) layer, but it may be formed of a high-k dielectric layer such as alumina ($Al_2O_3$). The insulating layer 319 of the silicon oxide ($SiO_2$) layer is formed by using a wet oxidation method under conditions for achieving the maximum step coverage to be filled in the first groove 317 and the second groove 318 or a dry oxidation method. Also in the case of using another material, the insulating layer 319 is formed to cover the channel region 306 of the substrate 300 while being filled in the first groove 317 and the second groove 318.

Figure 6E:
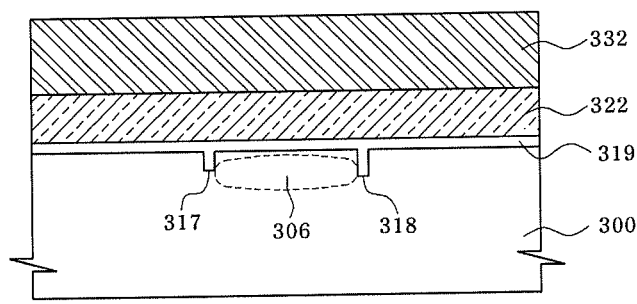

Referring to FIG. 6E, a conductive layer 322 for forming a gate electrode and an insulating layer 332 for forming a gate hard mask layer are sequentially formed on the insulating layer 319. The conductive layer 322 for forming a gate electrode is formed of a polysilicon layer doped with impurities. The conductive layer 322 may be formed to have a sequentially laminated structure including a polysilicon layer doped with impurities and a metal silicide layer. Further, according to circumstances, the conductive layer 322 may be formed of a metal layer. The insulating layer 332 for forming a gate hard mask layer is formed of a nitride layer.

Figure 6F:
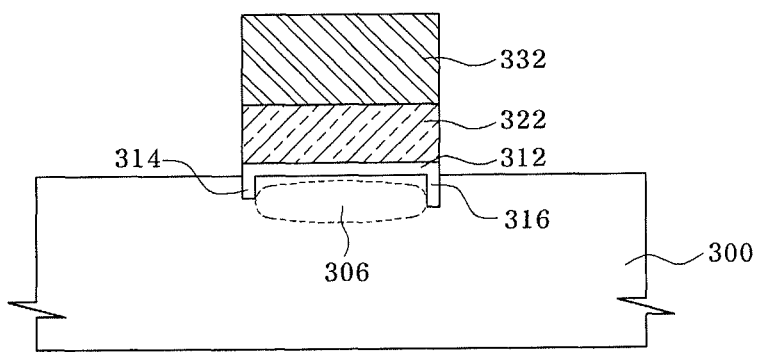

Referring to FIG. 6F, a planar gate stack is formed on the channel region 306 by patterning the insulating layer 332 for forming a gate hard mask layer, the conductive layer 322 for forming a gate electrode and the insulating layer 319 shown in FIG. 6E. The gate stack includes the first gate insulating layer 312 disposed on the channel region 306, the second gate insulating layer 314 and the third gate insulating layer 316 that are adjacent to the channel region 306 and buried in the substrate 300, and the gate electrode 320 and the gate hard mask layer 330 that are sequentially disposed on first gate insulating layer 312. Then, a gate spacer layer (not shown) is formed on the side wall of the gate stack. Implantation and diffusion are performed to form the first diffusion region 302 and the second diffusion region 304, serving as a source region and a drain region, in the upper portion of the substrate 300 as shown in FIG. 3.

As described above, in the MOS transistor and the method for fabricating the MOS transistor according to the present invention, the gate insulating layer having a specified depth from the surface of the substrate is disposed in the boundary between the channel region and an active region to extend the carrier moving path. Accordingly, although the planar gate stack is employed, the short channel effect can be suppressed and further the punchthrough margin can be increased. Moreover, when the MOS transistor according to the present invention is applied to memory devices such as DRAM, channel ion implantation is performed around the gate insulating layer buried in the substrate, thereby adjusting a threshold voltage and improving refresh characteristics.

Although the embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device comprising:
    a substrate;
    a first diffusion region and a second diffusion region separated from each other by a channel region in an upper portion of the substrate;
    a gate insulating layer including:
        a lateral portion disposed on the channel region of the substrate,
        a first vertical extension joined to a first edge of the lateral portion, and
        a second vertical extension joined to a second edge of the lateral portion, the second edge being opposite the first edge,
        wherein the second vertical extention is longer than the first vertical extension, such that the gate insulating layer is asymmetric; and
    a gate electrode disposed over the first gate insulating layer.

2. The device according to claim 1, wherein the lateral portion and the first vertical extension both include silicon oxide.

3. The device according to claim 1, wherein the first vertical extension extends about 30 nm to 100 nm below a lower side of the lateral portion.

4. The device according to claim 1, wherein the first diffusion region and the second diffusion region are respectively a source region and a drain region.

5. The device according to claim 1, wherein the first vertical extension defines a first non-linear current path, wherein the first non-linear current path extends from the channel region to the first diffusion region around the first vertical extension, and wherein the second vertical extension defines a second non-linear current path, wherein the second non-linear current path extends from the channel region to the second diffusion region, and wherein the second vertical extension is longer than the first vertical extension, such that the first and second non-linear current paths have different lengths.

6. A MOS transistor comprising:
    a substrate;
    a first diffusion region and a second diffusion region separated from each other by a channel region in an upper portion of the substrate;
    a gate insulator including:
        a first gate insulating layer disposed on the channel region of the substrate,
        a second gate insulating layer having a specified depth from the surface of the substrate and being disposed between the first diffusion region and the channel region, and
        a third gate insulating layer having a specified depth from the surface of the substrate and being disposed between the second diffusion region and the channel region,
        wherein the depth of the third gate insulating layer is greater than the depth of the second gate insulating layer, such that the gate insulator is asymmetric; and
    a gate electrode disposed on the first gate insulating layer.

7. The MOS transistor according to claim 6, wherein the first gate insulating layer, the second gate insulating layer and the third gate insulating layer include a silicon oxide layer.

8. The MOS transistor according to claim 6, wherein the depth of the second gate insulating layer is about 30 nm to 100 nm.

9. The MOS transistor according to claim 6, wherein the first, second, and third gate insulating layers comprise essentially the same material.

10. The MOS transistor according to claim 6, wherein the first diffusion region and the second diffusion region are respectively a source region and a drain region.

11. The MOS transistor according to claim 6, wherein the first diffusion region and the second diffusion region are respectively a drain region and a source region.

12. The device according to claim 6, wherein the second gate insulating layer defines a first non-linear current path, wherein the first non-linear current path extends from the channel region to the first diffusion region around the second gate insulating layer, and wherein the third gate insulating layer defines a second non-linear current path, wherein the second non-linear current path extends from the channel region to the second diffusion region, and wherein the depth of the third gate insulating layer is greater than the depth of the second gate insulating layer, such that the first and second non-linear current paths have different lengths.

* * * * *